United States Patent [19]

Coe

[11] Patent Number: 4,754,310

[45] Date of Patent: Jun. 28, 1988

[54] HIGH VOLTAGE SEMICONDUCTOR DEVICE

[75] Inventor: David J. Coe, Redhill, United Kingdom

[73] Assignee: U.S. Philips Corp., New York, N.Y.

[21] Appl. No.: 678,365

[22] Filed: Dec. 4, 1984

Related U.S. Application Data

[63] Continuation of Ser. No. 324,883, Nov. 25, 1981, abandoned.

[30] Foreign Application Priority Data

Dec. 10, 1980 [GB] United Kingdom ................ 8039499

[51] Int. Cl.[4] ..................... H01L 29/06; H01L 29/80; H01L 29/78; H01L 29/48
[52] U.S. Cl. ........................................ 357/13; 357/14; 357/15; 357/20; 357/22; 357/23.4; 357/23.8; 357/34; 357/35; 357/55; 357/65; 357/68; 357/86
[58] Field of Search ................... 357/13, 20, 22, 23.4, 357/23.8, 34–36, 38, 42, 55, 65, 68, 86, 80, 14, 15

[56] References Cited

U.S. PATENT DOCUMENTS

| | | | |
|---|---|---|---|
| 3,171,068 | 2/1965 | Denkewalter et al. | 357/14 |
| 3,370,209 | 2/1968 | Davis et al. | 357/38 |
| 3,413,527 | 11/1968 | Davies | 357/23.8 |
| 3,417,301 | 12/1968 | Galli et al. | 357/80 |
| 3,515,952 | 6/1970 | Robinson | 357/80 |
| 3,660,732 | 5/1972 | Allison | 357/23.7 |
| 3,925,803 | 12/1975 | Kobayashi | 357/14 |
| 4,109,270 | 8/1978 | vonBasse et al. | 357/23 VD |
| 4,117,508 | 9/1978 | Koenig | 357/81 |
| 4,132,904 | 1/1979 | Harari | 357/42 |
| 4,134,123 | 1/1979 | Shannon | 357/22 X |
| 4,160,261 | 7/1979 | Casey, Jr. et al. | 357/23 X |
| 4,163,237 | 7/1979 | Dingle et al. | 357/16 |
| 4,163,241 | 7/1979 | Hutson | 357/38 |
| 4,219,835 | 8/1980 | vanLoon et al. | 357/56 |
| 4,296,429 | 10/1981 | Schroeder | 357/23 VD |
| 4,320,410 | 3/1982 | Nishizawa et al. | 357/35 |
| 4,379,305 | 4/1983 | Mitchell | 357/23 VD |
| 4,404,575 | 9/1983 | Nishizawa | 357/55 X |

FOREIGN PATENT DOCUMENTS

55-95366  8/1979  Japan .................. 357/23.4

OTHER PUBLICATIONS

H. M. J. Vaas et al., "High Voltage, High Current Lateral Devices", International Electron Devices Meeting (1980), *Technical Digest IEDM*, pp. 87–90.

S. Kaneda et al., "New Type of Varactor Diode Having Strongly Nonlinear C–V Characteristics", International Electron Devices Meeting (1977) *IEDM Technical Digest*, pp. 107–110.

*Primary Examiner*—J. Carroll
*Attorney, Agent, or Firm*—Paul R. Miller

[57] ABSTRACT

A field effect transistor, a bipolar transistor, a PIN diode, a Schottky rectifier or other high voltage semiconductor device comprise a semiconductor body having a depletion layer formed throughout a portion in at least a high voltage mode of operation of the device, such as, by reverse biasing a rectifying junction. The known use of a single high-resistivity body portion of one conductivity type to carry both the high voltage and to conduct current results in a series resistivity increasing approximately in proportion with the square of the breakdown voltage. This square-law relationship is avoided by the present invention in which a depleted body portion comprising an interleaved structure of first and second regions of alternating conductivity types carries the high voltage which occurs across the depleted body portion. The thickness and doping concentration of each of these first and second regions are such that when depleted the space charge per unit area formed in each of these regions is balanced at least to the extent that an electric field resulting from any imbalance is less than the critical field strength at which avalanche breakdown would occur in the body portion. The first regions in at least one mode of operation of the device provide electrically parallel current paths extending through the body portion.

49 Claims, 6 Drawing Sheets

HIGH VOLTAGE SEMICONDUCTOR DEVICE

This is a continuation, of application Ser. No. 324,883, filed Nov. 25, 1981 now abandoned.

This invention relates to high voltage semiconductor devices, particularly but not exclusively comprising one or more field-effect power transistors and/or other types of power devices such as rectifiers and bipolar transistors.

High voltage semiconductor devices are known comprising a semiconductor body and means for forming a depletion layer throughout a portion of the body in at least a high voltage mode of operation of the device. In known devices the body portion is of one conductivity type. The means forming the depletion layer depends on the particular type and form of device. The depletion layer may be formed in the body portion by field-effect action across a barrier layer separating a biasing gate from the semiconductor body. More usually the depletion layer is provided by reverse biasing a rectifying junction formed in the body by junction-forming means which adjoin a portion of the body. The junction-forming means may comprise, for example, a metal-based layer deposited on the body and forming a Schottky junction or, for example, a region of the body forming a p-n junction with the adjoining body portion. By controlling the spread of the depletion layer in the adjoining body portion, it is known to control the breakdown voltage of the reverse-biased junction so as to form a power device capable of handling high voltages in excess of, for example, 100 volts, and often very much higher.

In order to increase the depletion layer spread and so increase the breakdown voltage it is known for the associated body portion to be an extensive region of one conductivity type having a low conductivity-type determining doping concentration and hence a high resistivity. Particularly in some power rectifier diodes and field-effect transistor structures this low doped body portion adjoining the junction is often considered as being effectively intrinsic semiconductor material, even though it may have a conductivity-type determining doping concentration of, for example, about $10^{14}$ or $10^{15}$ atoms per $cm^3$. Such high resistivity body portions are often fully depleted at the high operating voltages used with these devices so that most of the applied revrese-bias voltage is dropped in the depletion layer extending across this body portion. In general it is found that in order to obtain a desired increase in breakdown voltage the resistivity of the body portion (and hence the reciprocal of the doping concentration) should be increased approximately in proportion to the desired voltage, and the length of the body portion should also increase approximately in proportion to the desired voltage to accommodate the increased spread of the depletion layer.

Particularly in majority-carrier devices such as field-effect transistors and Schottky diodes the current flowing through the device in the ON condition has to traverse this body portion so that the effect of increasing its resistivity and length is that the series resistivity of the current path increases in proportion to approximately the square of the desired reverse voltage. This limits the current handling capability of the device for a given maximum permissible thermal dissipation. It should be noted that the series resistivity (in $ohm.cm^2$) is the series resistance (in ohms) along a current path having a given length (measured in cms) and having unit cross-sectional area (1 $cm^2$).

Therefore such use of the same body portion both to conduct carriers in the ON condition and to block the operating voltage in the OFF condition results in the well-known restriction placed on the series resistance by the operating voltage of the device. This can undesirably restrict the voltage and current handling capabilities of a power device.

Furthermore, in order to increase the turn-off speed of a minority carrier device such as a PIN rectifier or a bipolar transistor, it is necessary to remove rapidly the minority charge carriers already injected into the high resistivity body portion. It is known to do this by further doping the body portion with recombination centers such as gold. However such centers act as lifetime killers which increase the series resistance of the body portion when the device is in the ON condition and increase the leakage current across the reverse-biased junction in the OFF condition.

According to the present invention there is provided a high voltage semiconductor device comprising a semiconductor body and means for forming a depletion layer throughout a portion of the body in at least a high voltage mode of operation of the device, characterized in that the body portion comprises a plurality of first regions of a first conductivity type interleaved with second regions of the opposite, second conductivity type, in that the total number of first and second regions is at least four, in that at least the first regions in at least one mode of operation of the device provide electrically parallel current paths extending through the body portion, and in that the first and second regions are depleted of free charge-carriers in the high voltage mode of operation to form interleaved positive and negative space charge regions and so serve to carry the high voltage occurring across the body portion when depleted of free charge-carriers by the depletion layer spreading therein with the thickness and doping concentration of each of the first and second regions being such that the space charge per unit area formed in each of the interleaved regions when depleted of free chargecarriers by the depletion layer is balanced at least to such an extent that the electric field resulting from the space charge is less than the critical field strength at which avalanche breakdown would occur in the body portion.

Such a device structure in accordance with the invention can provide a power device designed with more freedom in obtaining desired voltage and current handling capabilities for the device. The electrically parallel current paths can significantly reduce the series resistance through the body portion of devices in accordance with the invention, as compared with known devices having a single current path. When the first and second regions are fully depleted this interleaved and substantially balanced structure in the body portion can appear to behave as effectively intrinsic material on a macroscopic scale so permitting a high voltage capability, for example in excess of 100 volts and even very much higher.

Because the space charge per unit area is substantially balanced in the body portion, both the first and second regions can be depleted of free charge-carriers across their entire thickness by a relatively low applied voltage at or above the pinch-off voltage for each region. This pinch-off voltage is the voltage at which a current path along a region is pinched off by a depletion layer spreading across the region from the p-n junction(s) formed with the adjacent region(s) of the interleaved structure, and its value may be for example in the range of 5 to 20 volts depending on the thickness and doping concentration of the regions. Therefore when a voltage above this pinch-off value is applied the body portion in the depleted area of the interleaved first and second regions gives the appearance of behaving on a macroscopic scale as effectively intrinsic material, due to the positive and negative space charges being both interleaved and substantially balanced. Thus a high breakdown voltage can be obtained with this interleaved structure, and the magnitude of this breakdown voltage can be increased by increasing the length of the interleaved regions. Such devices in accordance with the invention can therefore be designed to operate with voltages of at least 200 volts and often very much higher, for example 500 volts and even 1,000 volts and higher.

The interleaved regions can provide good current paths through the body portion. The space charge per unit area in each region must be substantially balanced with the charge in the adjacent region and must remain below a critical and constant value determined by the breakdown field of the semiconductor. Within these limitations the designer of a device in accordance with the invention has considerable freedom in the individual doping concentrations and thicknesses which he chooses for each of the interleaved regions. Thus by decreasing the thickness and increasing the doping concentration of each region, the effective doping concentration of the body portion can be increased independently of the desired breakdown voltage. In this way a power device can be designed in which surprisingly the series resistivity of the body portion is approximately proportional to the breakdown voltage. Therefore the breakdown voltage is not limited by the doping concentration to the same extent as occurs in known devices in which the series resistivity is proportional to the square of the breakdown voltage. This permits the use of a higher doping concentration to obtain a low series resistance and a high current carrying capability. Depending on the type of device, the current flowing in the ON condition may be carried by either the first regions or the second regions or by both, as will be described hereinafter. So far as the turn-off of minority-carrier devices is concerned, the interleaved and electrically parallel current paths of the regions can provide an efficient, rapid means for extracting injected minority carriers so permitting rapid turn-off without needing the further provision of recombination centres.

In order to permit current flow by majority carriers in these regions, their individual thickness should not be so small as to be fully depleted under zero bias conditions thereby pinching off the current path in the region. This therefore restricts the maximum number of interleaved regions (and hence the maximum number of electrically parallel current paths) in a body portion of given dimensions. The total number of interleaved first and second regions of a given thickness provided in any particular device may be limited by, for example, the geometry and orientation of the device in the semiconductor body, the dimensions of the semiconductor body, and technological factors involved in the manufacture of the device.

The first and second regions may be in the form of interleaved layers extending substantially parallel to a major surface of the body. This particular orientation of the interleaved regions is particularly simple to manufacture, for example by epitaxially depositing material of alternating conductivity type on a substrate which itself may or may not form one of the first and second regions. The doping concentration and thickness of each deposited layer can be carefully controlled to provide the required space-charge balance between the layers. This layer orientation of the interleaved regions also permits simple electrical connection of the regions. This may be effected by, for example, zones extending from the major surface locally through the interleaved layers. Such zones may be formed by the merging of diffused regions by dopant diffusion from both the substrate interface and the outer major surface of the epitaxial layers. However in this case if the total interleaved structure is thick the manufacturing steps needed to provide deep zones extending through this thick structure may undesirably affect the characteristics of the interleaves layers already provided. Therefore such deep zones are preferably avoided, and this may readily be effected by using grooves in the major surface of the body. Thus in a presently preferred form connection means electrically connecting the first regions and connection means electrically connecting the second regions are present in grooves in the major surface and contact their respective regions at side walls of the grooves. These grooves may have a U-shaped or a V-shaped cross-section and can be provided in a precise manner by anisotropic etching. At present it is preferred to use a V-shaped cross-section as this can facilitate definition of various areas of the device on the sloping side walls of the groove and permit better coverage of these side walls by deposited layers.

The first regions may be electrically connected to each other by metallization. However, depending on the arrangement and orientation of the interleaved structure it will generally be easier to avoid short-circuiting the first and second regions by using a third region of the body which forms a p-n junction with the second regions. Thus, the first regions may be electrically connected to each other by a third region of the body, which third region is of the first conductivity type and adjoins the first regions at an area spaced from junction-forming means.

The nature of the means forming the depletion layer will vary depending on the type and form of the device. In one form, a conductive layer forming a gate is separated from the semiconductor body by a barrier layer (for example, an insulating layer) and the depletion layer is formed by field-effect action across the barrier layer upon appropriately biasing the gate. In another form the depletion layer is formed by reverse-biasing a rectifying junction in the body. The means forming such a rectifying junction may comprise a metal-based layer provided on one end of the interleaved regions and forming a Schottky junction with the first regions, or the junction-forming means may comprise a further region of the body, which further region is of the second conductivity type and forms a p-n junction with one end of each of the first regions.

The present invention can be incorporated in many types of device, both majority-carrier and minority-carrier devices, for example power rectifiers, thyristors, bipolar transistors and field-effect transistors. The interleaved region structure can be used with advantage to increase the voltage and/or current handling capabilities of such devices.

Thus, in one form the device comprises a power rectifier diode (for example s Schottky diode or a PIN diode) with the interleaved regions forming an intermediate region between anode and cathode of the diode. In another form the device comprises a bipolar transistor with the interleaved regions providing adjacent parts of the base and collector of the transistor. In a further form the device comprises a thyristor with the interleaved regions forming adjacent parts of the base regions of the thyristor.

Various parts of the interleaved structure can be used with particular advantage as parts of a field-effect transistor either of the junction-gate type or of the insulated-gate type.

Thus a junction-gate field-effect transistor in accordance with the present invention is characterized in that the interleaved regions are present between source and drain of the transistor, in that the first regions provide channel regions of the transistor, and in that the second regions are connected to a gate of the transistor and serve as extensions of the gate. The gate may be a metal-based layer forming a Schottky barrier, or it may be a further region which is of the second conductivity type and which forms a p-n junction with one end of each of the first regions. As will be described hereinafter, when such a junction-gate field-effect transistor is operated in the ON condition, the p-n junctions between the first and second regions may even be forward-biased to achieve minority carrier injection for reducing the series resistivity by conductivity modulation. Such a mode of operation becomes beneficial when such minority carriers can be readily extracted via the interleaved regions and the gate during turn off.

An insulated-gate field-effect transistor in accordance with the present invention is characterized by having a source which is separated from the interleaved regions by a further region of the second conductivity type and by having at least one gate insulated from the further region for capacitively generating or otherwise controlling a conductive channel in the further region for charge carriers of the first conductivity type to flow between the transistor source and drain with the interleaved regions being present between the further region and the transistor drain, and the first regions further serving as extensions of the drain.

Such a semiconductor device may even comprise a second insulated-gate field-effect transistor which is of complementary conductivity type to the first-mentioned field-effect transistor with the second regions serving as drain extensions of the second transistor and forming a p-n junction with another region of the first conductivity type which separates the interleaved regions from a source of the second transistor with at least one gate of the second transistor being insulated from the other region for capacitively generating a conductive channel in the other region for charge carriers of the second conductivity type to flow between the source and drain of the second transistor.

For field-effect transistors and other devices, it can be advantageous to have a semiconductor body in the form of a plurality of superimposed semiconductor layers which provide the interleaved regions and the bottom layer of which is mounted on a dielectric substrate so as to provide a reflecting boundary condition for the electric field in the bottom layer adjacent the substrate.

A field-effect transistor formed in a single p-type silicon layer on a sapphire dielectric substrate is described in a paper entitled "A High Voltage Offset-Gate SOS/MOS Transistor" given by H. Sakuma, T. Kuriyama and T. Suzuki at the 1979 International Electron Devices Meeting (I.E.D.M.), Washington, U.S.A., and published by I.E.E.E. in I.E.D.M. Digest (1979), pages 594 to 597. N-type source and drain regions (n+) and an ion-implanted pinched resistor are provided in the p-type layer. The pinched resistor is a single n-type surface region which is fabricated to have the same amount of opposite impurity per unit area as the p-type layer. This single resistor region adjoins only the upper surface of the p-type layer because it forms a current-carrying extension of the drain zone which extends to beneath the insulated gate of the transistor and so is controlled over part of its length by this gate.

Because the n-type surface resistor region and underlying p-type part of the layer are designed to deplete vertically throughout the thickness of the layer at above a low drain voltage equal to the offset-gate pinched-off voltage, this known transistor exhibits quite a high breakdown voltage characteristic which is not limited by the doping level of the layer but depends on the length ($L_R$) by which the gate is offset from the n+drain region. This length $L_R$ equals the length of that part of the pinched-resistor which is not directly beneath the gate. The values for both the drain breakdown voltage ($BV_{DS}$) and the ON resistance ($R_{ON}$) of this known transistor were found to increase approximately linearly with the offset-gate length $L_R$. However as the single pinched resistor region provides the only current-carrying path from the channel to the drain, the series resistivity is still proportional to approximately the square of the desired breakdown voltage as in the other known devices described hereinbefore.

By contrast the present invention permits the series resistivity to increase only linearly with increase in the designed operating voltage and so provides a significant advantage.

Embodiments of the present invention will now be described, by way of example, with reference to the accompanying drawings, in which.

Figure 1:
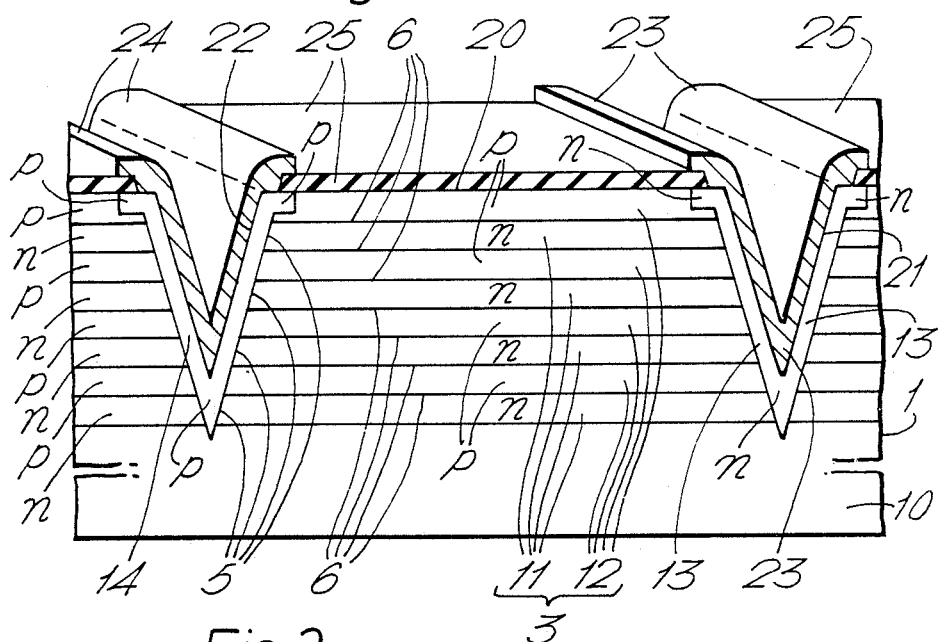
FIG. 1 is a diagrammatic cross-sectional view of part of one device structure in accordance with the invention.

It should be noted that FIGS. 1, 2, 4 to 8 and 10 to 14 are diagrammatic and not drawn to scale. The relative dimensions and proportions of some parts of these Figures have been shown exaggerated or reduced for the sake of clarity and convenience. The same reference numerals as used in one embodiment are generally used to refer to corresponding or similar parts in the other embodiments.

FIG. 1 illustrates one simple and basic form of interleaved structure which can be used in many different types of high voltage semiconductor device in accordance with the invention. The device comprises a semiconductor body 1 (for example of monocrystalline silicon) and means for forming a depletion layer throughout a portion 3 of the body 1 in at least a high voltage mode of operation of the device. The depletion layer is formed in the FIG. 1 structure by reversebiasing a rectifying junction 5 in the body 1. Such a junction may be formed by a metal-based Schottky contact to the body portion 3. However, FIG. 1 shows by way of example a p-type region 14 which adjoins the body portion 3 to form a p-n junction 5.

In accordance with the present invention the body portion 3 comprises a plurality of first regions 11 of a first conductivity type (for example n-type) interleaved with second regions 12 of the opposite, second conductivity type (for example p-type). At least the first regions 11 in at least one mode of operation of the device provide electrically parallel current paths extending through the body portion 3 towards the junction-forming means 14. The thickness and doping concentration of each of the first regions 11 and second regions 12 are such that the space charge per unit area formed in each of the interleaved regions 11,12 when depleted of free charge-carriers by the depletion layer is balanced at least to the extent that an electric field resulting from an imbalance in the space charge is less than the critical field strength at which avalanche breakdown would occur in the body portion 11,12. The first and second regions 11 and 12 serve to carry the high voltage occurring across the body portion 3 when depleted of free charge-carriers by the depletion layer spreading therein.

P-N junctions 6 formed between adjacent first and second regions 11 and 12 form extensions of the rectifying junction 5. The second regions 12 are electrically connectd together at the p-n junction 5 by the p-type region 14 which constitutes the junction-forming means. The first regions 11 are electrically connected to each other (for example by a region 13 of the same conductivity type) at at least one area spaced from the junction-forming means 14.

In the particular form illustrated in FIG. 1 the semiconductor body 1 comprises on a monocrystalline substrate 10 a plurality of superimposed epitaxial layers 11 and 12 of alternating conductivity type which provide the interleaved regions 11,12 of body portion 3. These layers 11 and 12 therefore extend substantially parallel to the upper major surface 20 of the body 1. The regions 13 and 14 are present in grooves 21 and 22 respectively in the surface 20 and contact the interleaved layers 11 and 12 respectively at side walls of these grooves. The number of layers 11,12, and the depth and spacing of the grooves 21,22 will vary depending on the particular type of device being formed and its desired voltage and current handling capabilities. However in a typical example the grooves may have a depth of about 10 micrometers and be spaced by about 100 micrometers.

The grooves 21 and 22 shown in FIG. 1 are of V-shape cross-section and may be formed in known manner by choosing an <100> crystal orientation for the surface 20 and using an anisotropic etchant solution. The regions 13 and 14 may be formed by dopant introduction at the area of the grooves 21 and 22, for example by diffusion or ion implantation. Ion implantation using only low temperature annealing treatments is generally preferably in causing less disturbance to the interleaved layer structure 11,12. A passivating layer 25 formed on the surface 20 of the body 1 has contact windows at the area of the grooves 21 and 22. Via these windows deposited metal layer electrodes 23 and 24 contact the regions 13 and 14 respectively.

The space charge per unit area formed in each of the depleted regions 11 and 12 is given by the product of the thickness of the particular region and its conductivity type determining doping concentration. Therefore the same magnitude of space-charge can be obtained with a thinner region having a higher doping concentration, or vice versa, so that it is not necessary for all the layers 11 and 12 in the interleaved structure to have the same thickness and doping concentration. The required space-charge balance between the layers 11 and 12 is obtained by carefully controlling the thickness and doping concentration of the deposited material during the epitaxial growth of each of the layers 11 and 12. These parameters can be controlled during epitaxial growth and subsequent processing to within for example ±10%.

In order to avoid avalanche breakdown in the depleted interleaved structure 11,12 during high voltage operation of the device with the junction 5 reversebiased both the electric field resulting from the space charge in each region 11 and 12 of the depleted body portion 3 and the electric field resulting from any cumulative imbalance in the space charge of the interleaved structure 11 and 12 over the whole thickness of the body portion 3 must be less than the critical field strength for avalanche multiplication in the semiconductor material. In the bulk of a silicon body, this critical field is approximately $3 \times 10^5$ volts.cm$^{-1}$, and this corresponds to a fully depleted dopant dose of at most approximately $2 \times 10^{12}$ cm$^{-2}$. Therefore for a silicon epitaxial device structure as illustrated in FIG. 1 the dopant dose in each of the layers 11 and 12 should be less than approximately $4 \times 10^{12}$ cm$^{-2}$ (since each layer 11, 12 is depleted from both sides) and the cumulative variation in dopant dose over the whole of the interleaved structure in the body portion 3 should also be less than approximately $2 \times 10^{12}$ cm$^{-2}$. Typically the thickness of these epitaxial layers 11 and 12 will be between 0.2 micrometer and 2 micrometers with corresponding doping concentrations of less than approximately $2 \times 10^{17}$ cm$^{-3}$ and $2 \times 10^{16}$ cm$^{-3}$ respectively.

These doping concentrations are considerably higher than those used for the single-region high-resistivity and intrinsic junction-adjacent body portions to spread the depletion layer in previously known high voltage device structures. The interleaved layers 11 and 12 in accordance with the present invention can provide good current paths through the body portion 3 and their electrically parallel arrangement can significantly reduce the series resistance to obtain a good current handling capability for the device. Furthermore, because the positive space charge in the depleted n-type layers 11 is interleaved with the negative space charge in the depleted p-type layes 12, the body portion 3 when depleted during high voltage operation can appear to behave on a macroscopic scale as effectively intrinsic material so permitting a high voltage handling capability.

It is important to the high voltage handling capability of the device that the respective regions 13 and 14 (or any other connection means) which electrically connect the n-type layers 11 together and the p-type layers 12 together should do so at the oppositely located sides of the depleted body portion 3 (i.e. at opposite ends of the high voltage carrying portion or portions of the interleaved layers 11 and 12) so that the interleaved layers 11 and 12 in the high voltage carrying portion 3 or portions 3 of the body extend longitudinally from one connection means 13 or 14 to the other connection means 14 or 13 which connects together the layers of the other conductivity type. This is achieved in the device structure of FIG. 1 at the side-walls of the separate grooves 21 and 22 which extend across the thickness of the interleaved layer structure 11,12 from the major surface 20.

Figure 3:
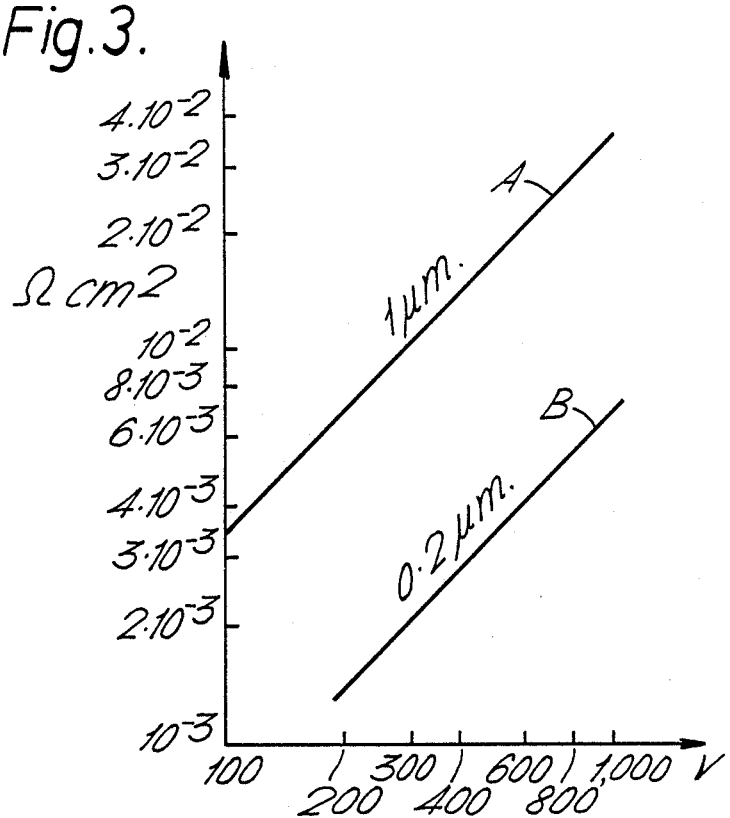
FIG. 3 is a graph relating the series resistivity in ohm.cm$^2$ to breakdown voltage in volts for a majority carrier device in accordance with the invention.

The voltage capability can be increased by increasing the length of the interleaved layers 11 and 12 forming the depleted body portion 3 carrying the high voltage. Increasing the number of these layers 11 and 12 also increases the number of electrically parallel current paths. As a result the series resistivity of the body portion 3 of such a power device having the interleaved layers 11 and 12 in accordance with the invention increases only in proportion to the desired breakdown voltage, rather than in proportion to the square of the desired breakdown voltage as occurs in the known devices described hereinbefore. This is illustrated in FIG. 3 which is a graph of the series resistivity in ohm.cm$^2$ versus breakdown voltage in volts, both on logarithmic scales. The graph is based on computed results for a device structure of this basic form having such interleaved layers 11 and 12 extending between grooves 21 and 22, with an ohmic contact to the layers 11 at the groove 21 and a common Schottky contact to both the layers 11 and 12 at the groove 22. The series resistivity was calculated with low bias applied between these two end contacts. The doping concentration of each of the layers 11 and 12 was taken to be $4 \times 10^{12}$ cm$^{-2}$. The length of the current paths in the layers 11 and 12 between the end contacts was chosen so as to give a maximum field of $10^5$ volts per cm along the length of the layers 11 and 12 with the designed reverse operating voltage applied between the two end contacts. The depth of the body portion 3 available for all the layers 11, 12 (i.e. the total thickness of the whole interleaved structure) was taken as 10% of this length. The results were calculated for whole numbers of alternatively-doped layer pairs 11 and 12 fitting into this available depth.

The resulting relationship between the series resistivity and breakdown voltage is given by line A for layers 11 and 12 which are each 1 micrometer thick and by line B for layers 11 and 12 which are each 0.2 micrometer thick. It should be noted that in each case there is a linear and direct proportional relationship. Furthermore in the previously known devices the series resistivities required for breakdown voltages of 200 volts and 500 volts were typically greater than $2 \times 10^{-2}$ ohm.cm$^2$ and $10^{-1}$ ohm.cm$^2$ respectively. As shown in FIG. 3 the corresponding series resistivities are significantly lower for interleaved device structures in accordance with the invention; with 1 micrometer thick layers 11 and 12 they are, for example, typically approximately $7 \times 10^{-3}$ ohm.cm$^2$ for 200 volts, less than $2 \times 10^{-2}$ ohm.cm$^2$ for 500 volts, and less than $4 \times 10^{-2}$ ohm.cm$^2$ for 1000 volts, whereas with 0.2 micrometer thick layers 11 and 12 they are less than $2 \times 10^{-3}$ ohm.cm$^2$ for 200 volts, less than $4 \times 10^{-3}$ ohm.cm$^2$ for 500 volts, and approximately $7 \times 10^{-3}$ ohm.cm$^2$ for 1000 volts.

As can be seen by comparing lines A and B it is generally advantageous to have a larger number of thinner layers 11 and 12, rather than a smaller number of thicker layers. The total number of interleaved layers 11 and 12 is at least four and will usually be very many more (e.g. eight or more) to derive significant advantage from using an interleaved structure in accordance with the invention. For a given depth of body portion 3 the maximum number of layers 11 and 12 which can be incorporated is determined by the minimum thickness usable for each individual layer 11 and 12. However if the individual layers 11 and 12 are too thin it may become difficult to produce them in a manufacturing process with sufficient reproducibility of their desired properties. Furthermore in order to permit majority carrier current flow in these layers 11 and 12, their individual thickness should not be so small as to be fully depleted under zero bias conditions thereby pinching off the current path in the layer.

Apart from dimensional and technological factors, the total number of interleaved layers 11 and 12 of a given thickness which can be incorporated into the grooved epitaxial structure of FIG. 1 is limited by the cumulative imbalance in space charge over the epitaxial layer structure of the body portion 3 and (in the case of V-shaped grooves) by the imbalance in series resistance between the shortest current path through the uppermost layer 11 or 12 and the longest current path through the lowermost layer 11 or 12 adjacent the bottom of the V-groove. However this imbalance in series resistance can be corrected by progressively decreasing the doping concentration (and hence the space charge) in both layers 11 and 12 from the lowermost to uppermost layer 11,12.

In order to reduce the electric field at the top surface of the body portion 3 the doping concentration and/or the thickness of the uppermost p-type layer 12 can be reduced. Thus, the depleted uppermost p-type layer 12 may have, for example, only approximately half the negative space charge of the other p-type layers 12. The passivating layer 25 provided over the uppermost layer 12 may have a charged state; for example the layer 25 may be positively charged if it is of silicon dioxide. In this case the space charge in the uppermost layer 11,12 may be modified to compensate for such insulating layer charge. However the passivating layer 25 may comprise semi-insulating material (such as for example oxygen-doped polycrystalline silicon) so that it is electrically neutral.

The monocrystalline substrate on which the epitaxial layers 11 and 12 are provided may be of dielectric material, for example sapphire or may be of semiconductor material, for example silicon. Thus, the substrate 10 of FIG. 1 may be of semiconductor material of the same conductivity type as the second regions 12 and the junction-forming region 14, and so may itself be considered as forming part of the means which form a p-n junction with the body portion 3. However the substrate 10 may be of semiconductor material of opposite conductivity type and so be considered as forming part of the body portion with which the region 14 forms the rectifying junction.

When the substrate is a semiconductor substrate 10 of opposite conductivity type to the lowermost layer of the interleaved structure 11,12, its doping concentration and thickness may be chosen such that the sapce charge occurring in the depleted part of the substrate 10 with reverse bias of the junction 5 substantially balances the opposite space charge occurring in the depleted lowermost layer of the interleaved structure 11,12. Thus, the substrate 10 may form one of the first and second regions 11 and 12. The doping and thickness of the junction-forming region 14 and connection region 13 may be chosen similarly so as to balance their space charge with that of the first and second regions 11 and 12.

The form of device structure illustrated in FIG. 1 may be incorporated in many different types of high voltage device, both majority carrier and minority carrier devices, for example power rectifiers, thyristors, bipolar transistors and field-effect transistors to increase their voltage and/or current handling capabilities. If in operation high voltages are applied to one of the electrodes 23 and 24 while the other electrode or electrodes are always grounded or have only low applied voltages, the groove associated with the high voltage electrode should generally be laterally surrounded (and so separated from the edge of the body 1) by the groove associated with the grounded or low-voltage electrode(s). This avoids voltage breakdown problems at the edge of the body 1.

Figure 2:
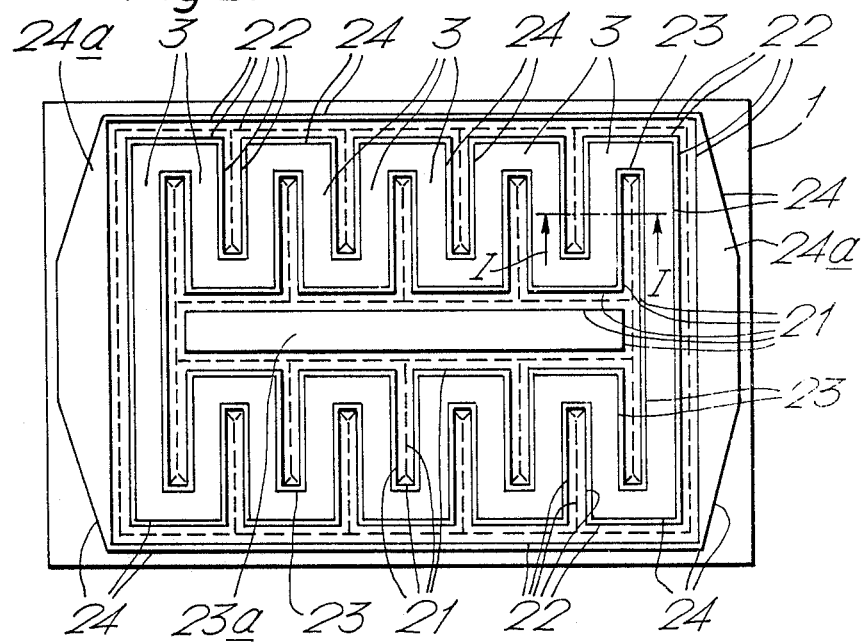
FIG. 2 is a diagrammatic plan view of a semiconductor device in accordance with the invention of which FIG. 1 may be a section taken on the line I—I of FIG. 2.

Such an arrangement is illustrated in FIG. 2, in which the groove 22 and electrode 24 surround the groove 21 and electrode 23. In this case the electrode 24 has expanded areas 24a for wire-bonding or other external connection which are located (on the passivating layer 25 or a thicker insulating layer) between the outside of the groove 22 and the edge of the body 1. In order to provide a platform for an expanded connection area 23a of the electrode 23 the groove 21 surrounds a mesa portion of the layer structure 11, 12 and the contact region 13 also extends over the top of this mesa portion to be contacted both there and in the groove 21 by the electrode 23. In the diagrammatic plan view of FIG. 2 the extent of the passivating layer 25 and of the various regions in the semiconductor body 1 are not shown for clarity of the drawing. The V-shaped grooves 21 and 22 are indicated by two parallel solid lines corresponding to their top outer edges and by a central broken line corresponding to their bottom apex. The extent of the electrodes 23 and 24 is indicated by solid lines in FIG. 2 corresponding to their edges.

Also, in order to increase further the current handling capability of such a device structure in accordance with the invention the grooves 21 and 22, electrodes 23 and 24 and the regions 13 and 14 may be interdigitated. Such an interdigitated arrangement is also illustrated in FIG. 2.

The device structure of FIG. 2 may be, for example, a p-n junction power rectifier diode having only two terminal electrodes 23 and 24. The interleaved layers 11 and 12 form an intermediate region between the anode and cathode of the diode and may be considered as effectively equivalent to an intrinsic base region of a PIN diode. However compared with known PIN diodes the series resistivity for a given breakdown voltage can be significantly lower, so that a rectifier diode in accordance with the invention can have increased voltage and/or current handling capabilities.

Such a p-n junction diode is a minority carrier device in which the current flowing in the ON condition is carried by minority charge carriers in both the first and second regions 11 and 12. Because of its interleaved structure, this device can have a rapid turn-off without requiring gold-doping to provide recombination centers in the body portion 3. Thus, when the reverse voltage is applied, the minority carriers (holes) in the n-type layers 11 will be pulled across the p-n junctions 6 into the p-type layers 12 and rapidly extracted from the body portion 3 along these electrically parallel layers, and similarly the electrons in the p-type layers 12 will be rapidly extracted via the n-type layers 11. Whent the applied reverse voltage level rises above the low pinch-off value (for example in the range of 5 to 20 volts) the depletion layers associated with the p-n junctions 6 merge together in the layers 11 and 12 to deplete entirely the body portion 3 between the regions 13 and 14.

Figure 4:
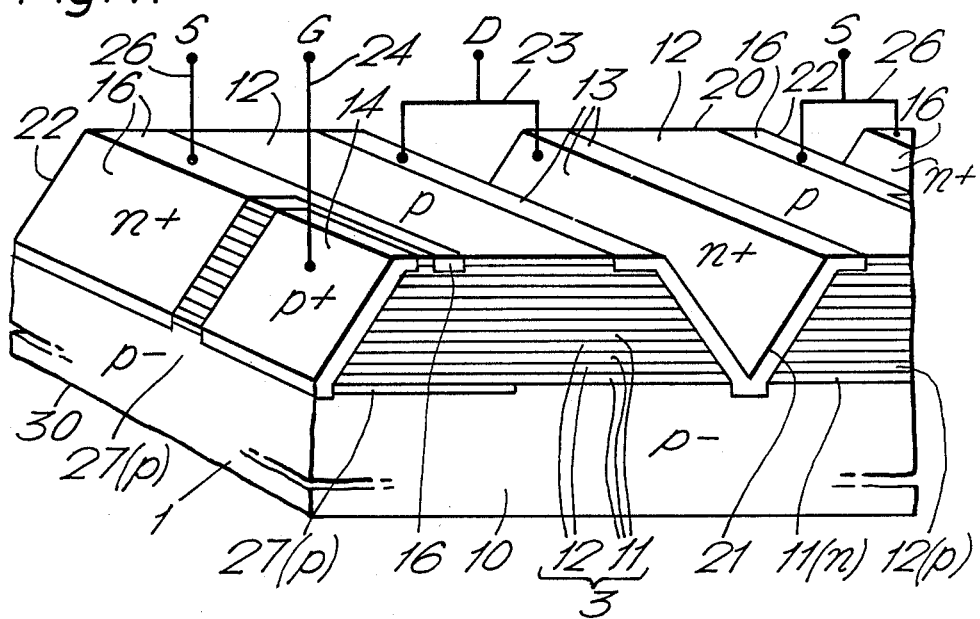
FIG. 4 is a diagrammatic partial cross-sectional and perspective view of part of a junction-gate field effect transistor in accordance with the invention.
Figure 5:
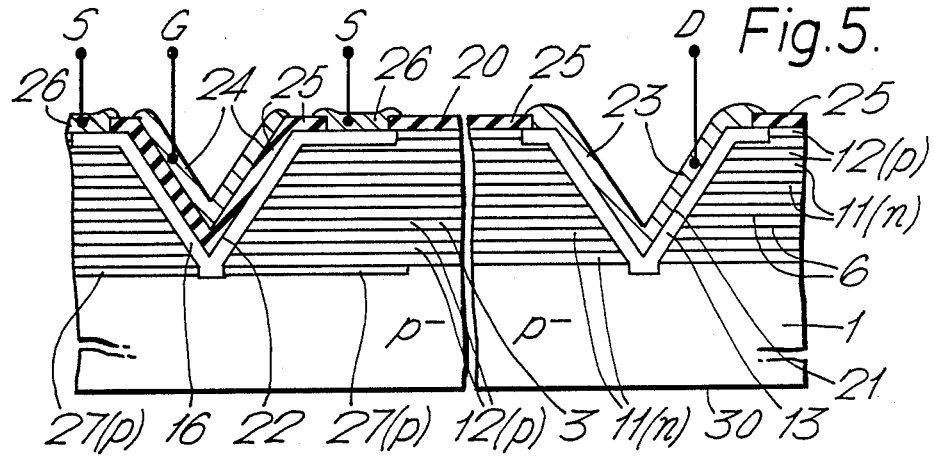
FIG. 5 is a diagrammatic cross-sectional view through the source and drain of the junction-gate field effect transistor of FIG. 4.

FIGS. 4 and 5 illustrate the incorporation of such a V-grooved epitaxial interleaved layer structure in a majority carrier device, namely a junction-gate field-effect transistor in accordance with the invention. The interleaved layers 11 and 12 of alternating conductivity type are now present between the transistor source and drain. N-type region 13 which extends along the entire side-walls of the groove 21 now forms the drain region which is contacted by the electrode 23 in the same manner as illustrated in FIG. 1. For the sake of clarity the insulating layer 25 and details of the electrode arrangement are not shown in FIG. 4.

The groove 22 now has associated with it both p-type regions 14 which form the transistor gate and n-type regions 16 which form the source region of the transistor. As shown in FIG. 4, these regions 14 and 16 may be in the form of alternate fingers extending locally down the side-walls of the V-groove 22, and ends of the interleaved layers 11 and 12 may then extend to these side-walls at the areas between adjacent gate and source regions 14 and 16. The regions 14 and 16 can be formed by localized ion implantation using known lithographic masking techniques. The p-type layers 12 now serve as extensions of the gate 14 and are interleaved with the n-type layers 11 which provide transistor channel regions connected between the source and drain regions 16 and 13. By using the gate 14 to reverse-bias the junctions 5 and 6 electron flow between the regions 16 and 13 can be controlled by field-effect action across the associated depletion layers until the bias voltage is sufficiently high to deplete fully the region 3 and turn-off the transistor. In the OFF state the transistor can block high drain voltages because of its interleaved structure 11,12 as explained hereinbefore.

If desired, when such a transistor is operated in the fully ON condition, the p-n junctions 6 between the layers 11 and 12 may even be forward-biased so that the gate injects holes into the channel regions 11 to further reduce the series resistivity by conductivity modulation. Such an unusual mode of operation is advantageous in this fieldeffect transistor in accordance with the invention because during turn-off the minority carriers can be readily extracted via the interleaved layers 12 and the gate 14.

Many different geometries are possible for incorporating source and gate electrodes at the groove 22 in this transistor structure. In the form illustrated in FIG. 5, the passivating layer 25 extends also over the side-walls of the groove 22 and has windows (not shown in FIG. 5) at the areas of gate regions 14 in the groove 22. The gate electrode 24 extends in and along the length of the groove 22 to contact the regions 14 at these windows. The portions of the gate electrode 24 which overlie the source regions 16 are insulated therefrom by the layer 25 as illustrated in FIG. 5. The layer 25 also has windows outside the groove 22 where a source electrode 26 extends alongside the groove 22 to contact the source regions 16 at the upper major surface 20 of the device. Preferably the source fingers extending into the groove 22 are connected together by part of the source region 26 extending outside the groove 22 so as to increase the contact area between the source region 16 and its electrode 26.

As interdigitated electrode arrangement with the groove 21 surrounded by the groove 22 may again be used in a modified form of the FIG. 2 arrangement to allow for both the gate electrode 24 and source electrode 26 associated with the groove 22. In a further modified form, the p-type substrate 10 may be sufficiently highly doped to provide a gate connection to the regions 14 so that the gate electrode is provided on the lower surface 30 of the body 1 instead of the surface 20.

Particularly in the case of a significantly-doped semiconductor substrate 10 the depth of the depletion layer in the substrate 10 may vary considerably along its length from adjacent the groove 21 to adjacent the groove 22, so that the space charge occurring in the depleted part of the substrate 10 varies correspondingly over the length. The opposite conductivity type doping concentrations of the substrate 10 and the lowermost layer 11 may be chosen such that in operation their space charges are balanced adjacent the groove 21. At the interface between the substrate 10 and the lowermost layer 11 a shorter p-type further layer 27 extending from the p-type region 14 can be incorporated to balance the substrate space-charge adjacent the groove 22 and to reduce the crowding of equi-potential lines in this area. Such a buried interface layer 27 may be incorporated in the junctiongate field-effect transistor as illustrated in Figures 4 and 5 and in any other semiconductor device which is in accordance with the invention and which has the interleaved layers 11 and 12 on a semiconductor substrate 10.

Typically the average channel length of the transistor of FIGS. 4 and 5, as measured between adjacent grooves 21 and 22, may be about 100 micrometers. The length of the layers 11 and 12 not only affects the breakdown voltage but can also affect the ON characteristics of the transistor. Thus, for example, the $I_D$:$V_{DS}$ characteristic (variation of drain current with source to drain voltage) may tend to become more pentode-like as the layer length is increased and more triode-like as the length is decreased.

Figure 6:
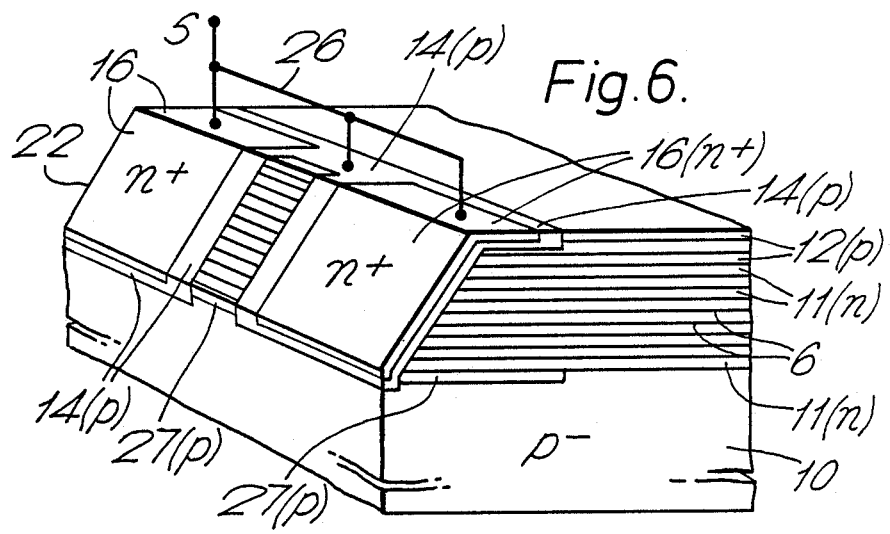
FIG. 6 is a diagrammatic partial cross-sectional and perspective view of part of the source and channel area of an n-channel insulated gate field effect transistor in accordance with the invention.
Figure 7:
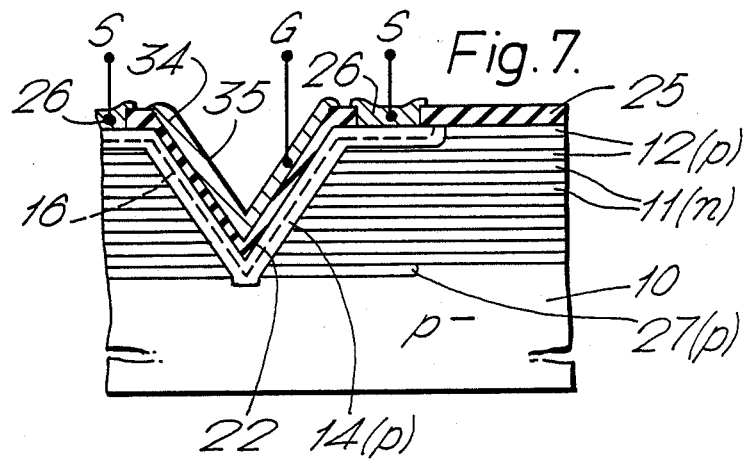
FIG. 7 is a diagrammatic cross-sectional view of the device area shown in FIG. 6.

FIGS. 6 and 7 illustrate a modification of the transistor structure of FIGS. 4 and 5 to form an n-channel insulated-gate field-effect transistor in accordance with the invention. This transistor may have its n-type drain region 13 and drain electrode 23 arranged in the groove 21 in the same manner as shown in FIGS. 4 and 5 for the junction-gate transistor. However as shown in FIGS. 6 and 7 a different arrangement of semiconductor regions, electrodes and insulating layers is now present at the groove 22. The n-type source regions 16 are now separated from the interleaved layers 11 and 12 of alternating conductivity type by the p-type region 14 in which it is formed, for example by localized ion implantation using lithographic masking techniques. The interleaved layers 11,12 extend from the n-type drain region 13 to the p-type region 14 and adjoin the side-walls of the groove 22 at areas between adjacent finger parts of the p-type region 14. In addition to the layer 25, a thinner insulating layer 35 now extends into the V-groove 22 to cover the side-walls of the V-groove 22 at windows in layer 25 so that the conductive gate layer 34 is insulated completely from the regions 14 and the ends of the layers 11 and 12 by the layer 35. The thicker insulating layer 25 insulates the gate layer 34 from the source region 16 in the groove 22.

The gate layer 34 serves for capacitively generating an n-type conductive channel in the p-type region 14 between the n-type source regions 16 and the ends of the n-type layers 11 at the side-walls of the groove 22. These layers 11 serve as extensions of the drain region 13, so that (in the ON state of the transistor) electrons from the source region 16 flow through the induced n-type channel and along the layers 11 to the drain region 13. In the OFF state the depleted interleaved layers 11 and 12 block high drain voltages as described hereinbefore.

The cross-section of FIG. 7 is taken through the conductive channel area of the region 14. The source electrode 26 which extends alongside the groove 22 contacts both the source regions 16 and the p-type region 14 at the major surface 20 via a window in the insulating layer 25. the lateral extent of the source region 16 at the groove 22 is indicated by the broken outline in the cross-section of FIG. 7.

Although the IGFET illustrated in FIGS. 6 and 7 is of the n-channel enhancement type, an n-channel depletion type IGFET can be formed readily by providing a low-doped n-type region adjacent the side-wall areas of the groove 22 between the source regions 16 of the transistor structure of FIGS. 6 and 7.

In the n-channel transistor shown in FIGS. 6 and 7 the n-type layers 11 carry current through the body portion 3. However it is also possible to incorporate a p-channel transistor structure in this same device so that the current is carried by both the layers 11 and 12. The resulting device has the FIGS. 6 and 7 structure at the groove 22 and the FIG. 8 structure at the groove 21. The resulting circuit diagram is shown in FIG. 9. In this transistor the n-type region 13 now has the same shape as the p-type region 14 and forms not only the drain of the n-channel transistor but also a region in which the p-type channel is induced by the gate G(2) of the complementary transistor structure. In the n-type region 13 there is a further p-type region 28 which has the same shape as the n-type source regions 16 and forms the source region of the p-channel transistor structure.

The insulating layer and electrode structure provided at the groove 21 also corresponds in layout to that at the groove 22. Thus, the gate G(2) extends in the groove 21 on a thin insulating layer over the channel, and on the thick insulating layer 25 over the region 28. The electrode connection D' extends alongside the groove 21 to contact both regions 13 and 28 at a window in the insulating layer 25. In FIG. 9 the gate and source connection associated with the groove 22 and denoted by G and S in FIGS. 6 and 7 are not denoted as G(1) and S' respectively. The references p and n in FIG. 9 denote the current paths through the p-type layers 12 and n-type layers 11 respectively. It will be seen that these layers 12 and 11 can also act as gate regions to influence the current flow in the adjacent layers 11 and 12 in a manner equivalent to junction-gate field-effect transistors. These junction-gate transistor structures are also shown in FIG. 9.

Figure 10:
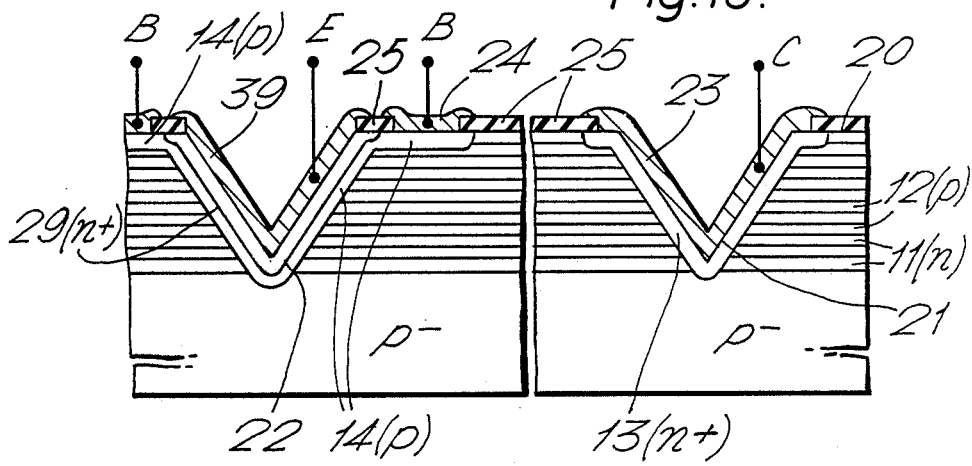
FIG. 10 is a diagrammatic cross-sectional view of part of a bipolar transistor in accordance with the invention.

FIG. 10 illustrates the application of the FIG. 1 structure to a high voltage bipolar transistor in accordance with the invention. In this case n-type region 13 and electrode 23 at groove 21 form the transistor collector while p-type region 14 and electrode 24 at groove 22 form the transistor base. The interleaved layers 11 and 12 form an effectively intrinsic region which provides adjacent parts of the base and collector at the base collector junction between the regions 14 and 13. The base electrode 24 extends alongside the groove 22 and contacts the base region 14 at the major surface 20 via a window in the insulating layer 25. An n-type emitter region 29 is present in the base region 14 and adjoins the side-walls of the groove 22 where it is contacted by an emitter electrode 39. Because the interleaved layers 11 and 12 permit rapid extraction of minority carriers when the transistor is turned-off, this bipolar transistor in accordance with the invention can have both a fast switching speed and good current and voltage handling capabilities.

Figure 11:
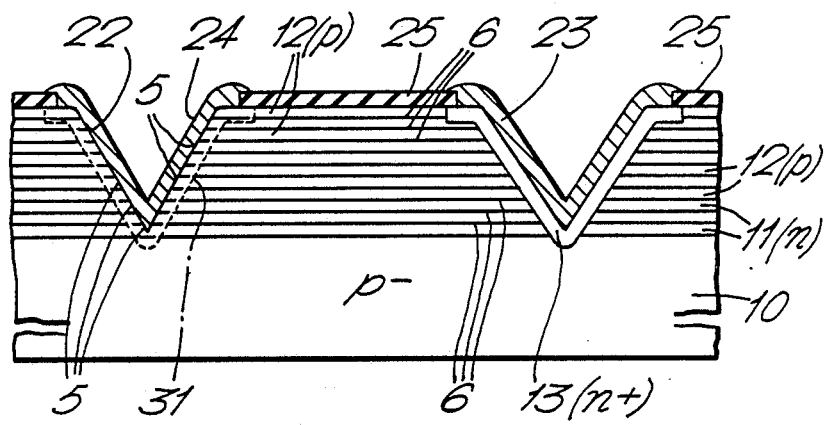
FIG. 11 is a diagrammatic cross-sectional view of a Schottky rectifier in accordance with the invention.

FIG. 11 shows a modification of the FIG. 1 structure as used for a high voltage Schottky diode. In this case, instead of a p-type region 14 the junction-forming means is metal layer 24 which forms a metal-semiconductor rectifying junction with the n-type layers 11. The interleaved layers 11 and 12 form an effectively intrinsic region between the diode anode formed by Schottky layer 24 and the cathode formed by electrode 23 and n-type region 13. In this device the layer 24 forms a reverse Schottky barrier with the p-type layers 12. It is desirable to control the area of this p-Schottky contact so as to reduce its reverse current and thus to suppress possible minority carrier effects from the p-n junctions 6. This can be effected by incorporating at intervals along the groove 22 additional n-type regions 31 adjoining the side-walls of the groove 22. The thickness of such a region 31 is indicated by dots in FIG. 11. Where the regions 31 are present they prevent the interleaved layers 12 contacting the side-walls of the groove 22. The layers 11 and 12 extend to the side-walls in the gaps between the regions 31.

It should also be understood that similar Schottky junctions formed at the grooves may be used in the devices of FIGS. 4 to 10. Thus, for example a junction-gate field-effect transistor in accordance with the invention may have a Schottky gate, and an insulated-gate field-effect transistor in accordance with the invention may have Schottky source and drain.

In the field-effec transistors of FIGS. 4 to 8 the gate electrodes are situated inside the groove 22. However if desired these gate electrodes may be situated outside the groove 22 and extend side by side with the source electrode 26. Thus the gate electrode 24 of the FIGS. 4 and 5 transistor may contact the gate region 14 at the major surface 20. Similarly, the thin gate insulating layer 35 may be present at the major surface 20 under the gate electrode 34 and over a surface-adjacent part of the region 14 where the channel is capacitively generated. However such configurations having the gate and source electrodes side by side outside the associated groove are less attractive in requiring more major surface area for the device body. An alternative configuration is to provide the source electrodes 26 within the groove 22 and the gate electrodes 24 and 34 outside the groove 22.

Figure 12:
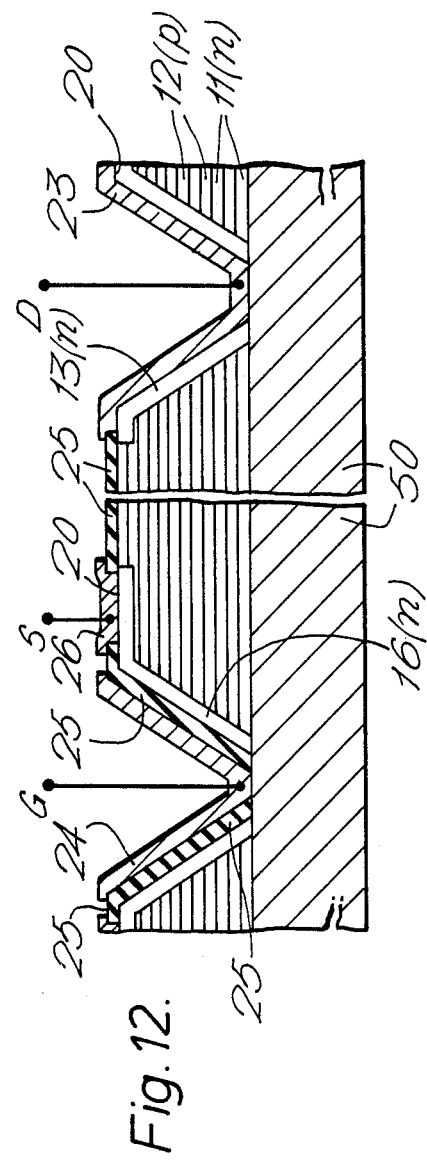
FIG. 12 is a diagrammatic cross-sectional view of another device in accordance with the invention and having a dielectric substrate.

Instead of using a semiconductor substrate 10 for the transistors of FIGS. 4 and 5, and 6 and 7 it can be particularly advantageous to provide the interleaved layers 11 and 12 on a monocrystalline dielectric substrate, such as for example sapphire. Such a substrte provides a reflecting boundary for the electric field lines in the interleaved structure 11 and 12 and provides an alternative means for obtaining a more uniform electric field in the layers 11 and 12 between the substrate 10 and the source region 16 and p-type region 14. Such a modification of the transistor of FIG. 5 is illustrated in FIG. 12, having a dielectric substrate 50 on which the interleaved layers 11 and 12 are present as semiconductor mesas.

Figure 13:
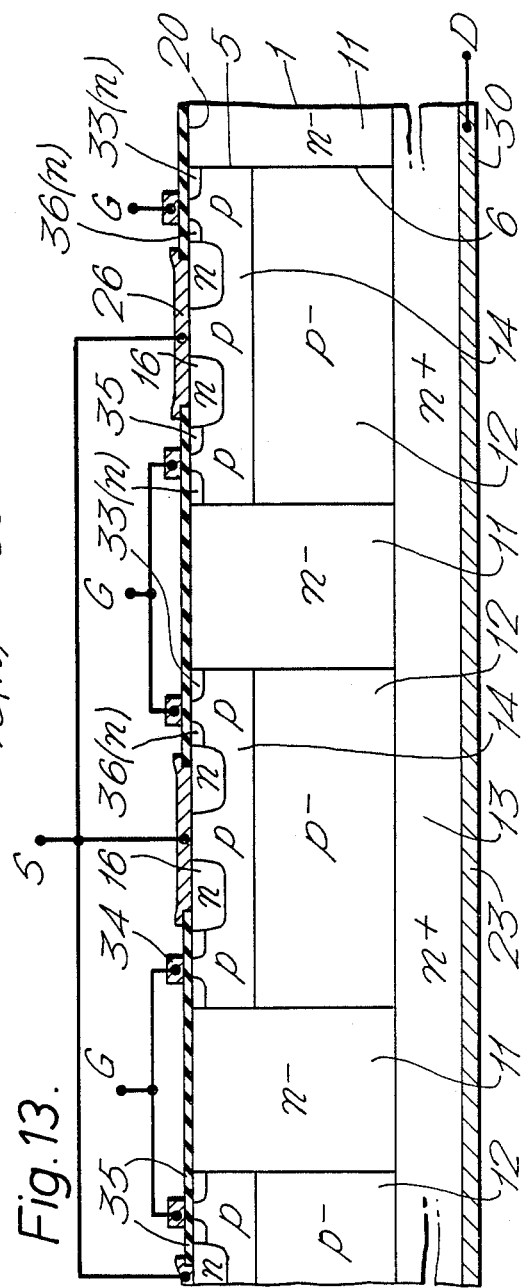
FIG. 13 is a diagrammatic cross-sectional view of an insulated gate field effect transistor having another form of device structure in accordance with the invention.

FIG. 13 shows part of another form of device structure in accordance with the invention in which the interleaved layers 11 and 12 extend perpendicular to the major surface 20 of the body 1, instead of being parallel thereto. The major device regions 13, 14 etc. and electrodes 23, 26 etc. are now present at the opposite major surface 20 and 30 of the device body 1. Such a configuration can be obtained starting with a high resistivity p-type epitaxial layer on a low-ohmic n-type substrate 13. If the major surfaces of the substrate 13 have a <110> crystal orientation, then for silicon semiconductor material vertically-sided grooves can be formed in the epitaxial layer in known manner using an anisotropic etchant, the etching being continued until the grooves reach the substrate 13. Then n-type material can be epitaxially deposited to fill these grooves so as to form the regions 11. The remaining parts of the original p-type epitaxial layer form the regions 12. The doping concentrations and widths of these regions 11 and 12 as determined by the etching and epitaxial depositions are chosen so that the space charge formed in them by depletion is substantially balanced and does not exceed the critical value for avalanche breakdown. The further device regions and electrodes, and in particular the region 14 and its contacting electrode (designated 26 in FIG. 13) can then be provided in known manner in and on the resulting structure, for example using ion-implantation, lithograhpic and etching techniques.

Such a form of device-structure having its regions 11 and 12 perpendicular to the major body surface 20 may be used for various types of high voltage device in accordance with the present invention, for example power rectifiers, bipolar transistors, and both junction-gate and insulated-gate field-effect transistors. FIG. 13 illustrates its application to an insulated-gate field-effect transistor, of which the substrate 13 and back electrode 23 form the drain. N-type source regions 16 are implanted in the p-type region 14, and both regions 14 and 16 are contacted at the surface 20 by the source electrode 26. A conductive gate electrode 34 is present on a thin gate insulating layer 35 in the area between the source regions 16 and the sides of the n-type regions 11 forming electrically parallel extensions of the drain region 13. Further low-doped, n-type regions 33 and 36 extend from the drain and source respectively to below the edge of the gate electrode 34.

Although in FIG. 13 each p-type region 14 is aligned with and has substantially the same width as the regions 12, the region 14 may be wider and/or the regions 11 and 12 may be narrower. Thus, for example, each p-type region 14 may overlie at least two p-type regions 12 and an intermediate n-type region 11.

Figure 14:
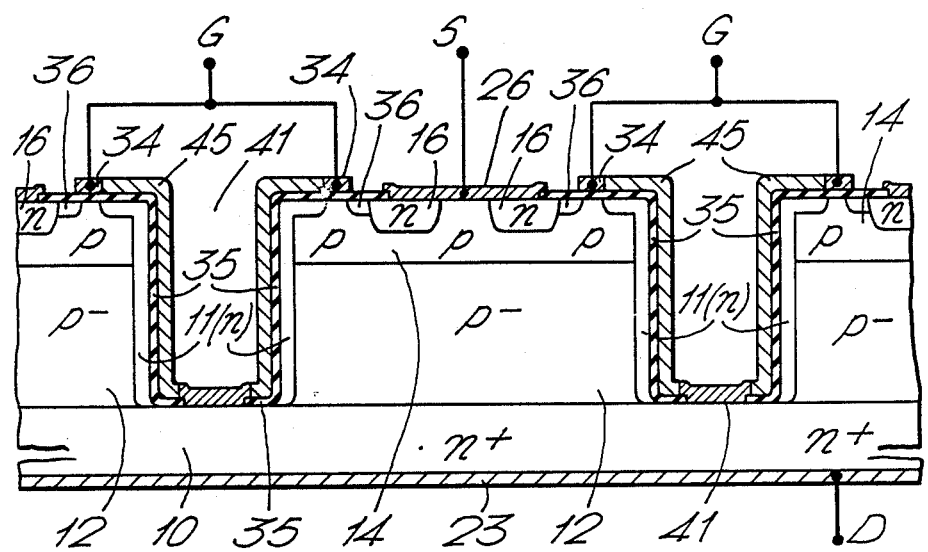
FIG. 14 is a diagrammatic cross-sectional view of pat of another insulated gate field effect transistor in accordance with the invention.

FIG. 14 shows a further modification (also in accordance with the invention) of the device structure of FIG. 13. In this modification each of the n-type regions 11 is separated into two parts by a vertically sided groove 41. These n-type regions 11 may be formed by dopant diffusion after etching the grooves 41 in the p-type epitaxial layer using the anisotropic etchant. Once again the doping concentration and thickness of these n-type regions 11 is so chosen that the positve space-charge occurring in a pair of these separated region parts 11 substantially balances the negative space-charge of a region 12. Both the insulating layer 35 and a resistance layer 45 extend over the side-walls of the groove 41. The resistance layer 45 is connected to the transistor gate 34 and substrate drain 10 to form field-relief means serving to spread the electrostatic field which occurs in the regions 11 and to reduce the magnitude of this field at the edge of the regions 11 adjacent the transistor channel area and gate 34. The resistance layer may be of high resistivity polycrystalline silicon which may be locally doped with a high donor concentration both above the channel area so as to form the gate 34 as part of the layer 45 and at the bottom of the groove 41 so as to form a good connection between the layer 45 and the substrate 10 at a window in the insulating layer 35.

Figure 8:
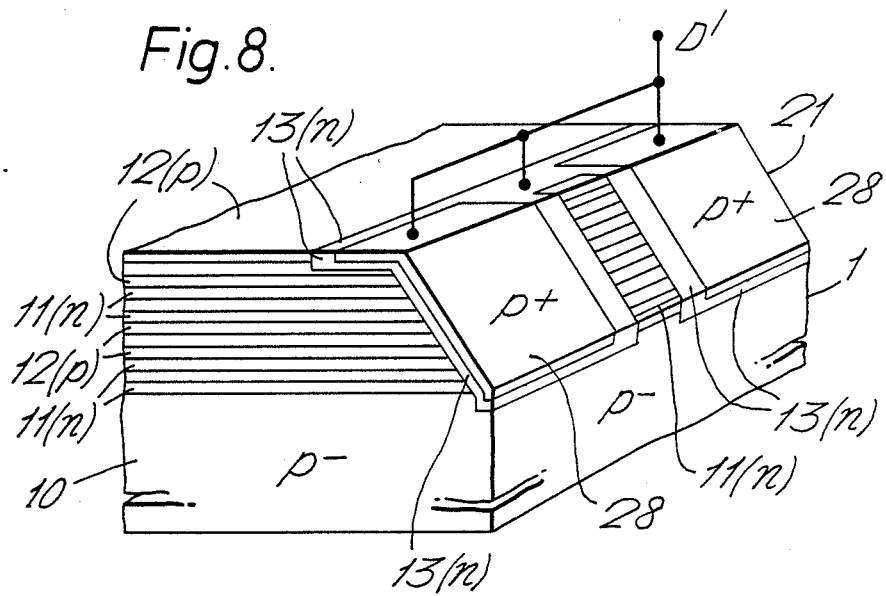
FIG. 8 is a diagrammatic partial cross-sectional and perspective view of part of a p-channel insulated gate field effect transistor in accordance with the invention.
Figure 9:
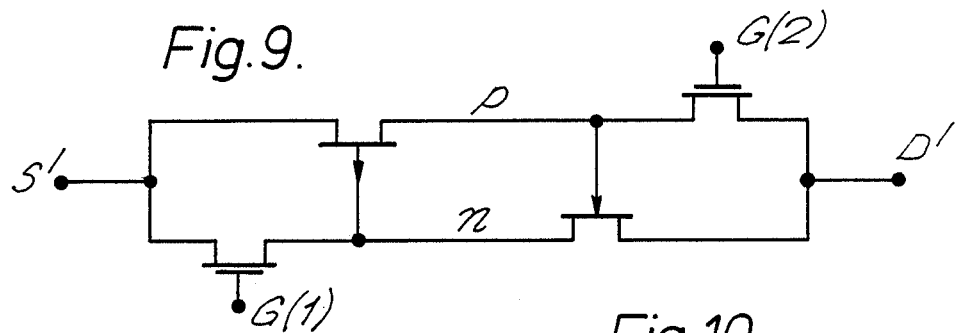
FIG. 9 is a circuit diagram of a device arrangement in accordance with the invention having both an n-channel field effect transistor of FIGS. 6 and 7 and a p-channel field effect transistor of FIG. 8.

FIG. 8 together with FIGS. 6 and 7 illustrate one example of a device in accordance with the invention comprising two circuit elements which are of complementary conductivity types and which are connected in an inverse parallel arrangement across said body portion, the interleaved first and second regions providing electrically parallel current paths of one circuit element interleaved with electrically parallel current paths of the complementary circuit element. Another example is a thyristor comprising n-p-n and p-n-p transistors. If so desired, such a thyristor may have separate gate electrodes for its p-type and n-type base regions.

I claim:

1. A high voltage semiconductor device comprising a semiconductor body having a barrier-forming means for providing a barrier with a portion of said semiconductor body, and electrode connection means for applying a voltage in excess of 100 volts across said barrier to form a depletion layer extending throughout said portion in at least a high voltage mode of operation, said portion comprising a plurality of first regions of a first conductivity type interleaved with a plurality of second regions of a second conductivity type, said first and second regions extending longitudinally traverse to said barrier, at least said first regions providing electrically parallel current paths extending through said portion transverse to said barrier in at least one mode of operation, said first and second regions being depleted of free charge-carriers across their thickness in said high voltage mode of operation to form interleaved positive and negative space charge regions, said positive and negative space charge regions serving to carry high voltage in excess of 100 volts by said depletion layer spreading from said barrier across said portion when depleted of free charge-carriers, said first and second regions having a length perpendicular to their thickness for carrying a voltage in excess of 100 volts across said portion when depleted of free charge carriers, said first and second regions each having a thickness and doping concentration to balance said space charge per unit area formed in each of said first and second interleaved regions when depleted of free charge-carriers by said depletion layer and carrying said voltage in excess of 100 volts, said space charge per unit area being balanced at least to such an extent that an electric field resulting from said space charge is less than a critical field strength at which avalanche breakdown would occur in said portion.

2. A device according to claim 1, wherein said interleaved first and second regions are layers extending substantially parallel to a major surface of said semiconductor body.

3. A device according to claim 2, wherein said electrode connection means include first connection means for electrically connecting said first regions and second connection means for electrically connecting said second regions, said first connection means and said second connection means being present in grooves in said major surface, said first and second connection means contacting respective first and second regions at side walls of said grooves.

4. A device according to claim 3, wherein said grooves have a V-shape cross section.

5. A device according to claim 1, wherein said doping concentration of each of said first and second regions is at least $2 \times 10^{16}$ cm$^{-3}$.

6. A device according to claim 1 or claim 2 or claim 3 or claim 4 or claim 5, wherein said first regions are electrically connected to each other by a third region of said first conductivity type, said third region adjoining said first regions at an area of said semiconductor body spaced from said barrier-forming means for forming said depletion layer.

7. A device according to claim 6, wherein said depletion layer is formed by a metal-based layer on one end of said first and second interleaved regions, said metal-based layer forming a Schottky junction with said first regions.

8. A device according to claim 6, wherein in one mode of operation current flows through said portion of said semiconductor body as minority carriers in at least said frist regions, said minority carriers being extracted across p-n junctions between said first and second interleaved regions upon switching operation to another mode.

9. A device according to claim 6, wherein said semiconductor body comprises a bipolar transistor, said first and second interleaved regions providing adjacent parts of a base and collector of said transistor.

10. A device according to claim 7, wherein said semiconductor body comprises a power rectifier diode, said first and second interleaved regions forming an intermediate region between an anode and cathode of said diode.

11. A device according to claim 10, wherein said semiconductor body is a plurality of superimposed semiconductor layers, said semiconductor layers providing said first and second interleaved regions, and said semiconductor layers being mounted on a dielectric substrate.

12. A device according to claim 6, wherein said semiconductor body comprises a junction-gate field effect transistor, said first and second interleaved regions being present between source and drain regions of said transistor, said first regions providing channel regions of said transistor, and said second regions being connected to a gate of said transistor, said second regions serving as extensions of said gate.

13. A device according to claim 12, wherein said gate is a further region of second conductivity type, said gate forming a p-n junction with one end of each of said first regions.

14. A device according to claim 12, wherein said semiconductor body is a plurality of superimposed semiconductor layers, said semiconductor layers providing said first and second interleaved regions, and said semiconductor layers being mounted on a dielectric substrate.

15. A device according to claim 6, wherein said semiconductor body comprises a first insulated-gate field effect transistor having a source, said source being separated from said first and second interleaved regions by a further region of second conductivity type, said transistor having at least one gate insulated from said further region for capacitively generating a conductive channel in said further region for charge carriers of said first conductivity type, said charge carriers flowing between said source and a drain of said transistor, said first and second interleaved regions being present between said further region and said drain, said first regions serving as extensions of said drain.

16. A device according to claim 15, wherein said semiconductor body further comprises a second insulated-gate field effect transistor being of complementary conductivity type to said first transistor, said second regions serving as extensions of a drain of said second transistor, and said second regions forming a p-n junction with another region of first conductivity type, said another region separating said first and second interleaved regions from a source of said second transistor, said second transistor having at least one gate insulated from said another region for capacitively generating a conductive channel in said another region for charge carriers of said second conductivity type to flow between said source and drain of said second transistor.

17. A device according to claim 15, wherein said semiconductor body is a plurality of superimposed semiconductor layers, said semiconductor layers providing said first and second interleaved regions, and said semiconductor layers being mounted on a dielectric substrate.

18. A device according to claim 6, wherein said semiconductor body comprises two circuit elements of complementary conductivity types, said two circuit elements being connected in an inverse parallel arrangement across said portion of said semiconductor body, said first and second interleaved regions providing electrically parallel current paths of one circuit element interleaved with electrically parallel current paths of the complementary circuit element.

19. A device according to claim 1 or claim 2 or claim 3 or claim 4, or claim 5 wherein said depletion layer is formed by a third region of said semiconductor body, said third region being of said second conductivity type and said third region forming a p-n junction with one end of each of said first regions.

20. A device according to claim 19, wherein in one mode of operation current flows through said portion of said semiconductor body as minority carriers in at least said first regions, said minority carriers being extracted across p-n junctions between said first and second interleaved regions upon switching operation to another mode.

21. A device according to claim 19, wherein said semiconductor body comprises a bipolar transistor, said first and second interleaved regions providing adjacent parts of a base and collector of said transistor.

22. A device according to claim 19, wherein said semiconductor body comprises a power rectifier diode, said first and second interleaved regions forming an intermediate region between an anode and cathode of said diode.

23. A device according to claim 22, wherein said semiconductor body is a plurality of superimposed semiconductor layers, said semiconductor layers providing said first and second interleaved regions, and said semiconductor layers being mounted on a dielectric substrate.

24. A device according to claim 19, wherein said semiconductor body comprises a junction-gate field effect transistor, said first and second interleaved regions being present between source and drain regions of said transistor, said first regions providing channel regions of said transistor, and said second regions being connected to a gate of said transistor, said second regions serving as extensions of said gate, and said gate comprising said third region of said second conductivity type.

25. A device according to claim 24, wherein said semiconductor body is a plurality of superimposed semiconductor layers, said semiconductor layers providing said first and second interleaved regions, and said semiconductor layers being mounted on a dielectric substrate.

26. A device according to claim 19, wherein said semiconductor body comprises a first insulated-gate field effect transistor having a source, said source being separated from said first and second interleaved regions by a further region of second conductivity type, said transistor having at least one gate insulated from said further region for capacitively generating a conductive channel in said further region for charge carriers of said first conductivity type, said charge carriers flowing between said source and a drain of said transistor, said first and second interleaved regions being present between said further region and said drain, said first regions serving as extensions of said drain.

27. A device according to claim 26, wherein said semiconductor body further comprises a second insulated-gate field effect transistor being of complementary conductivity type to said first transistor, said second regions serving as extensions of a drain of said second transistor, and said second regions forming a p-n junction with another region of first conductivity type, said another region separating said first and second interleaved regions from a source of said second transistor, said second transistor having at least one gate insulated from said another region for capacitively generating a conductive channel in said another region for charge carriers of said second conductivity type to flow between said source and drain of said second transistor.

28. A device according to claim 26, wherein said semiconductor body is a plurality of superimposed semiconductor layers, said semiconductor layers providing said first and second interleaved regions, and said semiconductor layers being mounted on a dielectric substrate.

29. A device according to claim 19, wherein said semiconductor body comprises two circuit elements of complementary conductivity types, said two circuit elements being connected in an inverse parallel arrangement across said portion of said semiconductor body, said first and second interleaved regions providing electrically parallel current paths of one circuit element interleaved with electrically parallel current paths of the complementary circuit element.

30. A device according to claim 1, wherein said depletion layer is formed by a metal-based layer on one end of said first and second interleaved regions, said metal-based layer forming a Schottky junction with said first regions.

31. A device according to claim 1, wherein in one mode of operation current flows through said portion of said semiconductor body as minority carriers in at least said first regions, said minority carriers being extracted across p-n junctions between said first and second interleaved regions upon switching operation to another mode.

32. A device according to claim 1, wherein said semiconductor body comprises a bipolar transistor, said first and second interleaved regions providing adjacent parts of a base and collector of said transistor.

33. A device according to claim 1, wherein said semiconductor body comprises a power rectifier diode, said first and second interleaved regions forming an intermediate region between an anode and cathode of said diode.

34. A device according to claim 1, wherein said semiconductor body comprises a junction-gate field effect transistor, said first and second interleaved regions being present between source and drain regions of said transistor, said first regions providing channel regions of said transistor, and said second regions being connected to a gate of said transistor, said second regions serving as extensions of said gate, and said gate comprising a third region of said second conductivity type.

35. A device according to claim 34, wherein said gate provides a p-n junction with one end of each of said first regions.

36. A device according to claim 1, wherein said semiconductor body comprises a first insulated-gate field effect transistor having a source, said source being separated from said first and second interleaved regions by a further region of second conductivity type, said transistor having at least one gate insulated from said further region for capactively generating a conductive channel in said further region for charge carriers of said first conductivity type, said charge carriers flowing between said source and a drain of said transistor, said first and second interleaved regions being present between said further region and said drain, said first regions serving as extensions of said drain.

37. A device according to claim 36, wherein said semiconductor body further comprises a second insulated-gate field effect transistor being of complementary conductivity type to said first transistor, said second regions serving as extensions of a drain of said second transistor, and said second regions forming a p-n junction with another region of first conductivity type, said another region separating said first and second interleaved regions from a source of said second transistor, said second transistor having at least one gate insulated from said another region for capacitively generating a conductive channel in said another region for charge carriers of said second conductivity type to flow between said source and drain of said second transistor.

38. A device according to a claim 36, wherein said semiconductor body is a plurality of superimposed semiconductor layers, said semiconductor layers providing said first and second interleaved regions, and said semiconductor layers being mounted on a dielectric substrate.

39. A device according to claim 1, wherein said semiconductor body comprises two circuit elements of complementary conductivity types, said two circuit elements being connected in an inverse parallel arrangement across said portion of said semiconductor body, said first and second interleaved regions providing electrically parallel current paths of one circuit element interleaved with electrically parallel current paths of the complementary circuit element.

40. A device according to claim 1, wherein said plurality of first regions is at least two, and said plurality of second regions is at least two.

41. A device according to claim 1, wherein the total number of said first and second regions is at least four.

42. A device according to claim 1, wherein said semiconductor body further comprises a substrate upon which said first and second interleaved regions exist.

43. A device according to claim 42, wherein said substrate is of dielectric material.

44. A device according to claim 43, wherein said dielectric material is sapphire.

45. A device according to claim 42, wherein said substrate is of semiconductor material.

46. A device according to claim 45, wherein said semiconductor material is silicon.

47. A device according to claim 45, wherein said semiconductor material of said substrate is of said second conductivity type.

48. A device according to claim 2, wherein said semiconductor body comprises a plurality of superimposed semiconductor layers providing said first and second interleaved regions, said semiconductor layers being present on a semiconductor substrate of said second conductivity type, said substrate having a doping concentration and thickness such that space charge occurring under reverse bias in a depleted portion of said substrate substantially balances an opposite space charge in said depleted lowermost first region.

49. A device according to claim 45, wherein said semiconductor material of said substrate is of said first conductivity type.

* * * * *